United States Patent
Soininen et al.

(10) Patent No.: US 9,783,887 B2
(45) Date of Patent: Oct. 10, 2017

(54) APPARATUS AND METHOD

(75) Inventors: Pekka Soininen, Helsinki (FI); Sami Sneck, Vantaa (FI)

(73) Assignee: BENEQ OY, Vantaa (FI)

( * ) Notice: Subject to any disclaimer, the term of this patent is extended or adjusted under 35 U.S.C. 154(b) by 456 days.

(21) Appl. No.: 13/816,870

(22) PCT Filed: Aug. 30, 2011

(86) PCT No.: PCT/FI2011/050752
§ 371 (c)(1),
(2), (4) Date: Mar. 14, 2013

(87) PCT Pub. No.: WO2012/028784
PCT Pub. Date: Mar. 8, 2012

(65) Prior Publication Data
US 2013/0164458 A1 Jun. 27, 2013

(30) Foreign Application Priority Data

Aug. 30, 2010 (FI) .................................. 20105901

(51) Int. Cl.
*C23C 16/455* (2006.01)

(52) U.S. Cl.
CPC .. *C23C 16/45551* (2013.01); *C23C 16/45544* (2013.01)

(58) Field of Classification Search
CPC .............. C23C 16/45551; C23C 16/40; C23C 16/45548
USPC ................................................. 118/718, 720
See application file for complete search history.

(56) References Cited

U.S. PATENT DOCUMENTS

| | | | |
|---|---|---|---|
| 2003/0113451 A1 | 6/2003 | Mayer et al. | |
| 2003/0170389 A1* | 9/2003 | Sandhu ............. | C23C 16/45504 427/255.28 |
| 2005/0084610 A1 | 4/2005 | Selitser | |
| 2008/0193643 A1* | 8/2008 | Dip ............................ | 427/255.5 |
| 2009/0078204 A1 | 3/2009 | Kerr et al. | |
| 2010/0037820 A1* | 2/2010 | Lee ................ | 118/719 |

(Continued)

FOREIGN PATENT DOCUMENTS

CN    1424429 A    6/2003
WO    WO 2008/130369 A1    10/2008

(Continued)

OTHER PUBLICATIONS

May 23, 2011 Search Report issued in Finnish Patent Application No. 20105901 (with translation).

(Continued)

*Primary Examiner* — Elizabeth Burkhart
(74) *Attorney, Agent, or Firm* — Oliff PLC

(57) ABSTRACT

The invention is related to an apparatus and a method for processing a surface of a substrate by exposing the surface of the substrate to alternating surface reactions of at least a first starting material and a second starting material according to the principles of atomic layer deposition method. According to the invention a first starting material is fed on the surface of the substrate locally by means of a source by moving the source in relation to the substrate, and the surface of the substrate processed with the first starting material is exposed to a second starting material present in the atmosphere surrounding the source.

14 Claims, 5 Drawing Sheets

(56) References Cited

U.S. PATENT DOCUMENTS

2010/0041213 A1    2/2010  Lee
2010/0068413 A1*   3/2010  Lee ................... C23C 16/45514
                                                              427/569
2010/0215871 A1*   8/2010  Lee ........................ C23C 16/06
                                                              427/569

FOREIGN PATENT DOCUMENTS

WO    WO 2009/032960 A1    3/2009
WO    WO 2011/135190 A1    11/2011

OTHER PUBLICATIONS

Dec. 23, 2011 Search Report issued in International Patent Application No. PCT/FI2011/050752.
Sep. 21, 2012 Preliminary Report on Patentability issued in International Patent Application No. PCT/FI2011/050752.

* cited by examiner

APPARATUS AND METHOD

BACKGROUND OF THE INVENTION

The invention relates to an apparatus and a method for processing a surface of a substrate by exposing the surface of the substrate to alternating surface reactions of starting materials. Specifically, the present invention relates to an apparatus for processing a surface of a substrate by exposing the surface of the substrate to alternating surface reactions of at least a first starting material and a second starting material according to the principles of atomic layer deposition method. Particularly, the present invention relates also to a method for processing a surface of a substrate by exposing the surface of the substrate to alternating surface reactions of at least a first starting material and a second starting material according to the principles of atomic layer deposition method.

Atomic Layer Deposition ALD method is based on deposition controlled by a surface, wherein the starting materials are conducted inside an ALD reactor onto the surface of the substrate one by one non-simultaneously and mutually separated. Traditionally starting material is brought onto the surface of the substrate in a sufficient amount so that all available binding sites of the surface will be in use. After each pulse of starting material the substrate will be flushed with inert gas so as to remove the excess of starting material steam in order to avoid the deposition from occurring in the gaseous phase. Then a chemisorbed monolayer of the reaction product of one starting material will remain on the surface. This layer reacts with the next starting material forming a partial monolayer of desired material. The reaction having occurred completely enough an excess amount of this second starting material steam will be flushed with inert gas, so the deposition is based on saturated surface reactions, i.e. the surface controls the deposition. According to a known technique the aforementioned ALD method will be carried in an ALD reactor in which the substrate to be processed is positioned.

One problem in the arrangement according to above described prior art technique is that with ALD reactors it is not possible to process pieces which are so large that they do not fit inside an ALD reactor. This limits considerably the use of the ALD method in many applications. Another problem is that the ALD method is used according to a known technique with vacuum. When depositing for example inner surfaces of containers the container itself may form an ALD reactor in which the vacuum is provided. However, wall thickness of such containers is often not sufficient, and the container may not withstand the necessary vacuum and the container may collapse. Moreover feeding of starting materials successively into large chambers may be difficult and time consuming, since filling and emptying of large chamber is slow. Moreover all the surfaces of the substrate placed in the chamber will be exposed to surface reactions, whereupon it is not possible to expose only part of the surface of the substrate to surface reactions without mounting on the surface of the substrate masks which cover part of the surface of the substrate. However placing of such masks is often slow and complicated.

BRIEF DESCRIPTION OF THE INVENTION

An object of the invention is thus to develop an apparatus and a method which solve the aforementioned problems. The object of the invention is solved by an apparatus that comprises one or more sources for feeding first starting material locally on a surface of a substrate, and in that the source is positioned in an atmosphere which comprises second starting material. The object of the invention is further achieved with a method that includes feeding on the surface of the substrate locally a first starting material by means of the source by moving the source in relation to the substrate and exposing the surface of the substrate processed with the first starting material to a second starting material present in the atmosphere surrounding the source.

The preferred embodiments of the invention are object of the dependent claims.

The invention is based on providing an apparatus, which comprises one or more sources for feeding first starting material locally on the surface of the substrate. The source may for example be a nozzle, nozzle head or like, which is adapted to feed a first starting material on the surface of the substrate. The first starting material reacts with the surface of the substrate forming a monolayer on the surface of the substrate. The source is provided movable in relation to the surface of the substrate so that by the source it is possible to sweep over the surface of the substrate or part of the surface by exposing this surface of the substrate left under the sweeping to a first starting material. The relative movement of the source and the substrate may be provided by moving uniquely the source or by moving uniquely the substrate or by moving both the substrate and the source relative to each other. According to the present invention the substrate and the source are positioned in an atmosphere which comprises second starting material. In other words the apparatus of the invention comprises feeding means for feeding second starting material to the atmosphere surrounding the source. Thus, when the surface of the substrate is exposed locally by means of the source to a first starting material, it will be exposed after having been swept by the source to a second starting material, which is present in the atmosphere surrounding the substrate. The second starting material reacts with the first starting material forming a monolayer on the surface of the substrate. This monolayer formed by the second starting material in turn reacts with the first starting material fed from the source upon next sweeping. Thus, the surface of the substrate may be processed locally by means of the source, when surface reactions occur on the surface of the substrate uniquely at the location which was swept by the source in order to expose the surface of the substrate to the first starting material.

As described before, the number of sweeps performed with the source may serve to determine the desired number of deposition layers and thus for example the thickness of the desired deposition, because as a result of each sweeping there is formed one monolayer of first and second starting material on the surface of the substrate. Processing of a surface means in this application generally depositing a surface, alloying a surface layer and/or some other corresponding procedure for processing a surface or a surface layer. On the surface of the substrate means in this context both the external surface and the internal surfaces of a porous substrate, which are provided by the porosity.

An advantage of the method and the apparatus of the invention is that it permits to use the ALD method also for processing surfaces of large pieces, which has not been possible earlier because of the dimensional limitation provided by ALD reactors. Moreover the present invention allows for local processing of such large pieces or surfaces, when processing of the whole surface is not desired or preferred, which has not been possible with prior art ALD reactors. Further, in the solution according to the present invention there is no need to use vacuum at all, or vacuum may be generated only at the location of the nozzle surface, whereupon thin-walled pieces are not exposed to vacuum, which might brake up the wall or collapse a thin-walled container. Moreover the present invention allows to process quickly large pieces with the ALD method and to use efficiently starting materials and possible flushing agents by minimizing the waste amount produced by the excess thereof.

BRIEF DESCRIPTION OF FIGURES

The invention will now be described in further detail in connection with preferred embodiments, with reference to the accompanying drawings, in which.

DETAILED DESCRIPTION OF THE INVENTION

Figure 1:
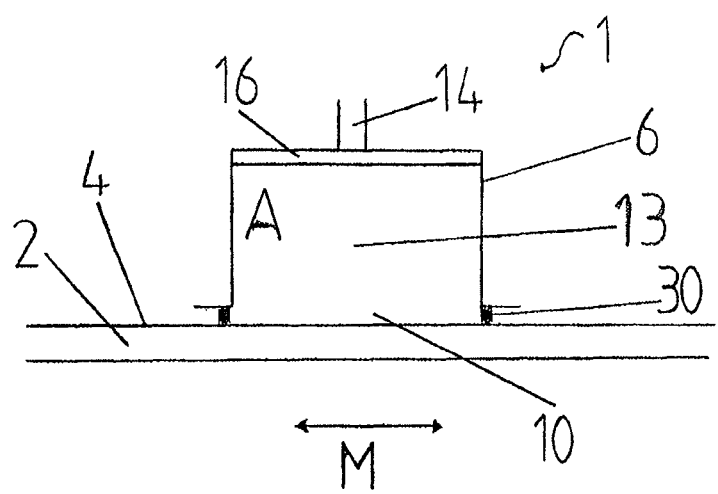
FIG. 1 shows schematically an embodiment of the apparatus according to the present invention.

Referring to FIG. 1 a first embodiment of the apparatus of the present invention is shown. According to FIG. 1 the apparatus comprises a source 6, which may be positioned on the surface 4 of the substrate 2 to be processed. The source 6 comprises a nozzle surface, which is placed against the surface 4 of the substrate 2 to be processed or on the surface 4 within a distance from the surface 4 so that the nozzle surface will cover part of the surface 4 of the substrate 2. Thus, the nozzle surface means in this context the surface of the source 6, which is placed against the surface 4 of the substrate 2 or on the surface 4. By means of the source a first starting material A is conducted via nozzle surface on the surface 4 of the substrate 2 at the region covered by the nozzle surface so that at this region covered by the nozzle surface the surface 4 of the substrate 2 may be exposed to a first starting material A. The first starting material A may be fed together with a carrier gas, which carrier gas may be an inert gas, which does not take part in the surface reactions on the surface 4 of the substrate 2. According to FIG. 1, the source 6 comprises a starting material space 13, into which the first starting material A may be fed by means of gas feeding means 14, which are in flow connection to the starting material space 13. Gas feeding means 14 may comprise any connections, tubings, starting material inserts and similar means and parts which are needed in order to produce and feed the first starting material A into the starting material space 13. In the embodiment of FIG. 1 a gas delivery device 16, such as an aperture plate or similar, is arranged in the upper part of the starting material space 13 in order to deliver uniformly the first starting material A originating from gas feeding means 14 into the starting material space 3. The starting material space 13 comprises an open wall or area, which opens to the nozzle surface forming a starting material zone 10, from which the first starting material A fed into the starting material space 13 will gain connection with the surface 4 of the substrate 2. In other words, according to the present invention first starting material A is able to discharge via the starting material zone 10 on the area of the surface 4 of the substrate 2 which is covered by the nozzle surface and particularly below the starting material zone 10, the source 6 being placed against the surface 4 of the substrate 2 or on the surface 4. The starting material space 13 of the source 6 thus forms an ALD reaction chamber with the part of the surface 4 of the substrate 2 on which the source 6 is located. Then deposition of material according to the ALD method may occur at this part of the surface 4 of the substrate 2 covered by the starting material zone 10 of the source 6 under the influence of the first starting material A. The nozzle surface of the source 6 may further be provided with bristles 30, which surround the starting material zone 10 and protrude outwardly from the nozzle surface so that a slit will remain between the nozzle surface and the surface 4 of the substrate 2. This slit together with the bristles 30 allows the excess starting material fed into the starting material space 13 to exit from the starting material space 13 and at the same time the bristles allow the source 6 to be used also on surfaces thereof which comprise irregularities which are small or lower than the height of the bristles 30. An underdosage or quasi underdosage may also be fed into the starting material space 13, whereupon substantially all of the first starting material A fed reacts with the surface 4 of the substrate 2. When using an underdosage no additional first starting material A is able to flow outside the starting material space 13.

According to the invention the source 6 is made movable so that it may be moved along the surface 4 of the substrate 2, the nozzle surface being against the surface 4 of the substrate 2 or on the surface within a distance therefrom. In other words, the source 6 is moved relative to the substrate 2. Alternatively the source 6 may be stationary, and the substrate 2, like the material web, is moved relative to the source 6, the source 6 being placed against or over the surface 4 of the substrate. Also both the substrate 2 and the source 6 may be moved in order to obtain a relative movement. In yet another embodiment the source 6 may be placed against or over the surface 4 of the substrate 2, lifted away from the surface 4 and transferred to the next place and repositioned against or over the surface 4 of the substrate 2. Then the source 6 is not moved along the surface of the substrate but is placed at the desired location, removed and placed to the next location on the substrate 2.

Using the source 6 according to FIG. 1 it is possible to process the surface 4 of the substrate 2 according to the ALD method by bringing by means of gas feeding means 14 a first starting material A into the starting material space 13, the surface 4 of the substrate 2 being exposed to a surface reaction provided by the first starting material B. By feeding the first starting material A at an underdosage relative to the capacity of the surface 4 of the substrate 2 to bind starting materials, substantially all of the fed first starting material A will bind onto the surface 3 of the substrate 2, so that there is no need to flush the surface separately. In case of overdosage the first starting material A in excess will exit the nozzle surface through bristles 30 or the slit between the nozzle surface and the surface 4 of the substrate 2. According to FIG. 1 the source 6 is positioned in a space the atmosphere 1 of which comprises a second starting material B. This space which has atmosphere 1, may for example be a separate chamber or a room space or some other corresponding space in which atmosphere 1, which contains the second starting material B, may be maintained. The relative movement of the source 6 on the surface 4 of the substrate 2 exposes the surface 4 to the first starting material A as the nozzle sweeps over the surface 4 and the surface 4 is exposed after sweeping to the second starting material B present in the atmosphere 1 of the space, when the source no more covers the location of the surface 4 of the substrate 2 which was swept by the source 6. Thus one sweep of source 6 over the surface 4 of the substrate 2 provides on the surface 4 one deposition layer of first and second starting material A, B in order to perform one complete ALD cycle. By feeding into the starting material space 13 an underdosage of first starting material A relative to the capacity of the surface 4 to bind starting material A the need of flushing the surface 4 may be eliminated, because all of the starting material A entering the surface via the starting material zone 10 binds to the surface 4. At the same time the carrying gas to be fed with the first starting material A flows through the bristles away from the nozzle surface by blowing away the second starting material B present in the atmosphere 1 preventing it from entering below the nozzle surface. The movement rate of the source 6 relative to the substrate 2 and the feeding rate of the first starting material A into the starting material space 13 may be dimensioned so that a desired underdosage state or other dosage state is obtained. Thus, by means of a reciprocating relative movement of the source 6 on the surface 4 of the substrate 2 a desired amount of deposition layers may be obtained, with each sweeping of the nozzle 6 one deposition layer is obtained. In FIG. 1, the reciprocating movement of the nozzle is illustrated by arrow M. The apparatus may also comprise two or more sources 6, which may be positioned for example on one another so that the substrate 2 may pass below these sources and be exposed to the second starting material B present in the atmosphere 1 between the sources.

Figure 2A:
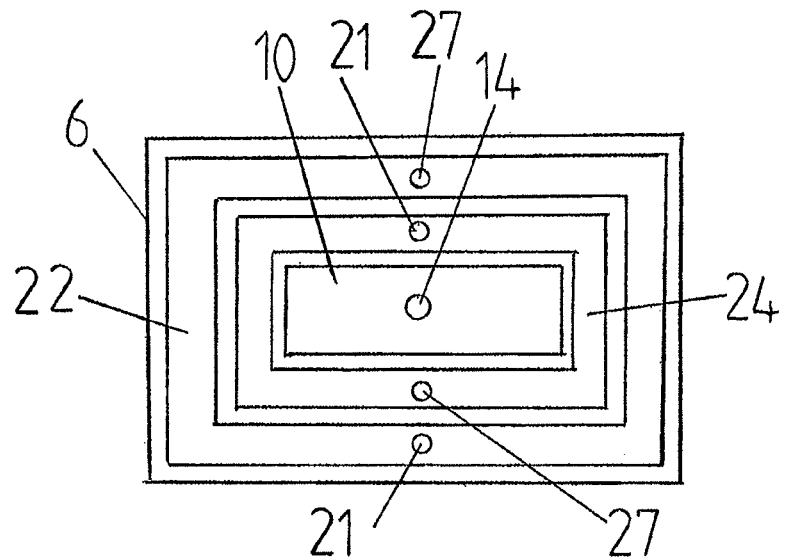
FIGS. 2A and 2B show schematically another embodiment of the apparatus according to the present invention.
Figure 2B:
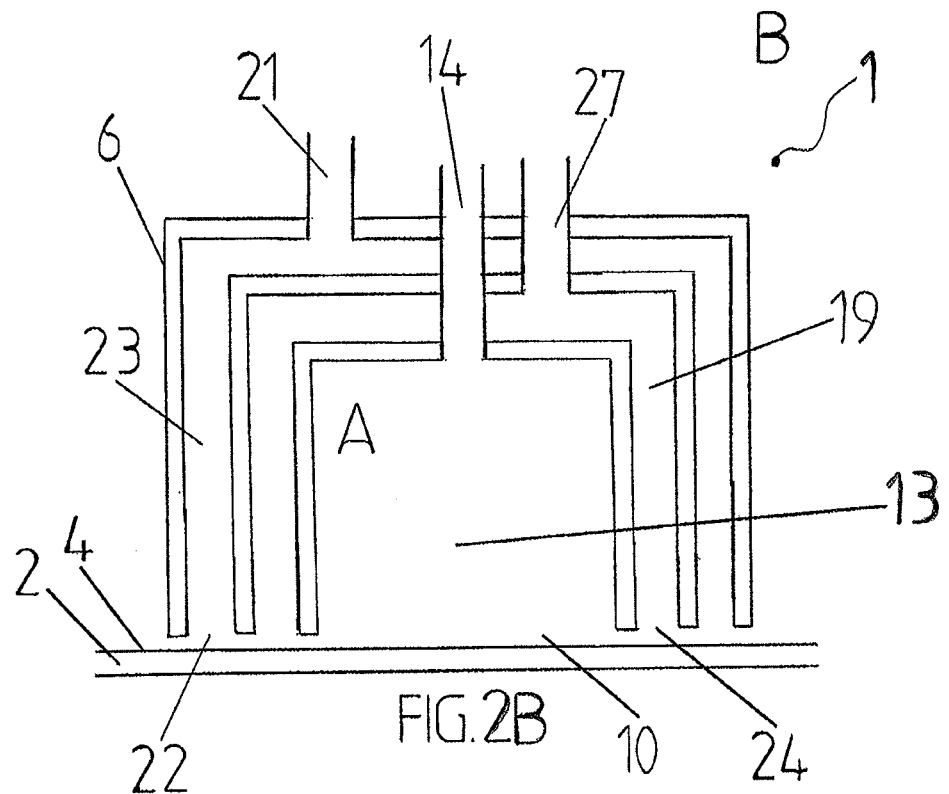

In FIGS. 2A and 2B there is shown a particular embodiment of the lamellar structured nozzle surface of the source 6. This source 6 according to FIGS. 2A and 2B corresponds with its operation principles and applications substantially to the source of FIG. 1, but in this source 6 according to FIGS. 2A and 2B there is a lamellar structure for feeding flushing agents as well as a suction for extracting the flushing agent and the starting materials. In the embodiment of FIGS. 2A and 2B the nozzle surface contains a starting material zone 10, through which the first starting material A is fed on the surface 4 of the substrate 2. In FIG. 2A there is shown a plan view of the nozzle surface, which comprises in the middle a starting material zone 10, to which first starting material A is brought by means of gas feeding means 14. Starting material zone 10 is surrounded by suction zone 24, on which suction or vacuum is provided by means of suction means or vacuum means 27, which are in flow connection to the suction space 19. The suction zone 24 in turn is surrounded by flushing agent zone 22, to which flushing agent is fed by means of flushing agent delivery means 21. With this solution it is possible to obtain around the reaction space defined by the starting material zone 10 zones of inert gas valving type, which further allow using the first starting material A at an overdosage. In FIG. 2B there is shown schematically in side view the solution according to FIG. 2A. Thus, the first starting material A fed into the starting material space 13 by means of gas feeding means 14 flows via the starting material zone 10 on the surface 4 of the substrate 2, wherein the excess first starting material A and/or carrying gas fed into the starting material space will be drawn from the slit between nozzle surface and the surface 4 of the substrate 2 into the suction space 19 and away from the surface 2 of the substrate 2. At the same time flushing agent is fed by means of flushing agent feeding means 21 into the flushing agent space 23, which flushing agent flows via the flushing agent zone 22 on the surface of the substrate and is further absorbed via the suction zone 24 into the suction space 19. By dimensioning suitably the feed pressure of the flushing agent, the efficiency of the feed pressure of the first starting material A as well as the surface areas of the flowing channels thereof, a source 6 may be achieved, inside which a good vacuum is present and when at the same time it however neutralizes by means of the feeding rate of the first starting material A and the flushing agent the suction force generated by vacuum, wherein the source 6 may be moved easily on the surface 4 of the substrate 2. Also in this embodiment the nozzle surface may be provided with bristles, which may be positioned around any one of the zones 10, 22, 24 and when needed around more or all of these zones 10, 22, 24. Further it is to be noted that two or more of the lamellar structures according to FIGS. 2A and 2B may be provided on a nozzle surface, and between these lamellar structures there may be a slit or gap or corresponding space, which is in flow connection to the atmosphere 1 in order to expose the surface 4 of the substrate 2 between the lamellar structures to starting material B. This source according to FIGS. 2A and 2B may be used in the same manner as the source according to FIG. 1 by providing a relative movement between the source 6 and the substrate 2.

According to the invention the nozzle surface is provided so that the source 6 comprises a starting material space 13, which is in flow connection to the gas feeding means 14, which starting material space 13 comprises a region opening to the nozzle surface of the source 6, which forms the starting material zone 10, through which the first material A is able to flow to the surface 4 of the substrate 2, the nozzle surface being placed against and on the surface 4 of the substrate 2 at a distance from the surface 4. Correspondingly the flushing agent space 23 is in flow connection to the flushing agent delivery means 21, which flushing agent space 23 comprises an area opening to the nozzle surface of the source 6, which forms the flushing agent zone 22, through which the flushing agent is able to flow to the surface 4 of the substrate 2, the nozzle surface being placed against or over the surface 4 of the surface 2. The suction space 19 is in flow connection to the suction means 27, which suction space 19 comprises an area opening to the nozzle surface, which area forms the suction zone 24, through which first starting material A and/or flushing agent may be drawn the nozzle surface being placed against or over the surface 4 of the substrate 2, and/or the suction space 19, which provides vacuum between the nozzle surface of the source 6 and the surface 4 of the substrate 2.

Although the lamellar solution of FIGS. 2A and 2B is shown as nested zones it may however be provided as successive zones. In other words the source 6 may comprise on the nozzle surface thereof in order to flush the surface 4 of the substrate 2 at least one flushing agent zone 22 for conducting flushing agent to the surface 4 of the substrate 2. The flushing agent zone 22 may further be arranged successively in respect to the moving direction of the substrate 2 or the source 6 with the starting material zone 10 and/or in the moving direction of the source 6 in front or rear side of the starting material zone 10. Likewise the source 6 may comprise in addition on the nozzle surface thereof at least one suction zone 24 for drawing the first starting material A and/or the flushing agent fed on the surface 1 of the substrate 2 and/or for providing vacuum between the nozzle surface of the source 6 and the surface 4 of the substrate 2. The suction zone 24 may be arranged successively in relation to the moving direction of the substrate 2 and the nozzle 6 with the starting material zone 10 in the same manner as was described in connection with the flushing agent zone 22, i.e. at the front or rear side or both sides of the starting material zone 10. Preferably the suction zone 24 is positioned between the starting material zone 10 flushing agent zone 22.

Figure 3:
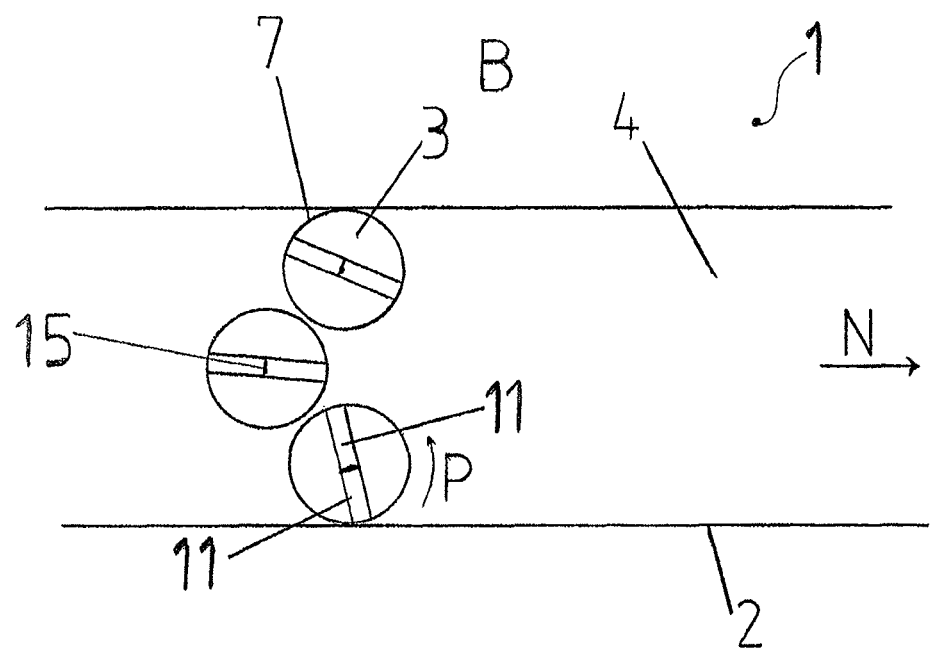
FIG. 3 shows schematically another embodiment of the apparatus according to the present invention.

In FIG. 3 there is shown a particular embodiment of the present invention, in which three similar sources 7 are positioned over a substrate 2 moving in the direction of arrow N, for example a material web, so that the nozzle surface of the source 7 is against or over the surface 4 of the substrate 2 at a distance from the surface 4. The sources 7 have in this embodiment a starting material feeding member 3 with a round nozzle surface, which starting material feeding member 3 is adapted to rotate about the rotation axis 15 or the center point thereof as described with the arrow P. The nozzle surface comprises a starting material zone 11, through which first starting material A may be fed on the surface 4 of the substrate 2 in the same manner as in the embodiment of FIG. 1. The sources 7 are again positioned in the atmosphere 1, which contains second starting material B. The sources 7 feed on the surface 4 of the substrate a first starting material A and the atmosphere 1 has a second starting material B, wherein the surface 4 would be exposed alternatively to starting materials A and B. The number of deposition layers available to the surface 4 of the web 2 and thus the thickness of the deposition layers may be controlled by means of the rotation speed of the nozzles 6 and the moving rate of the web. The sources 7 and the starting material feeding members 3 may also be provided with slits or corresponding zones (not shown), which are in flow connection to the atmosphere 1 so that the surface 4 of the substrate 2 may be exposed to surface reactions of the second starting material B present in the atmosphere 1, the source rotating about the first rotation axis 15. These slits may be provided for example in the gaps of starting material zones 11. The first rotation axis 15 extends in this embodiment substantially perpendicularly to the surface 4 of the substrate 2 and is adapted to feed first starting material A substantially in the direction of the first rotation axis 15 via the starting material zone 11.

In case of a moving web as in FIG. 3, sources according to FIGS. 1, 2A and 2B could of course also be used, one of more of which could be placed over the web 2 and which could extend from one edge of the web 2 to another, wherein the whole web 2 would pass below the source 6. Such sources according to FIGS. 1 and 2 would be moved over a moving web reciprocally, whereupon the number of deposition layers would increase, when the surface of the web 2 would be exposed alternately to the first starting material A fed through source 6 and to the second starting material B present in atmosphere 1.

Figure 4:
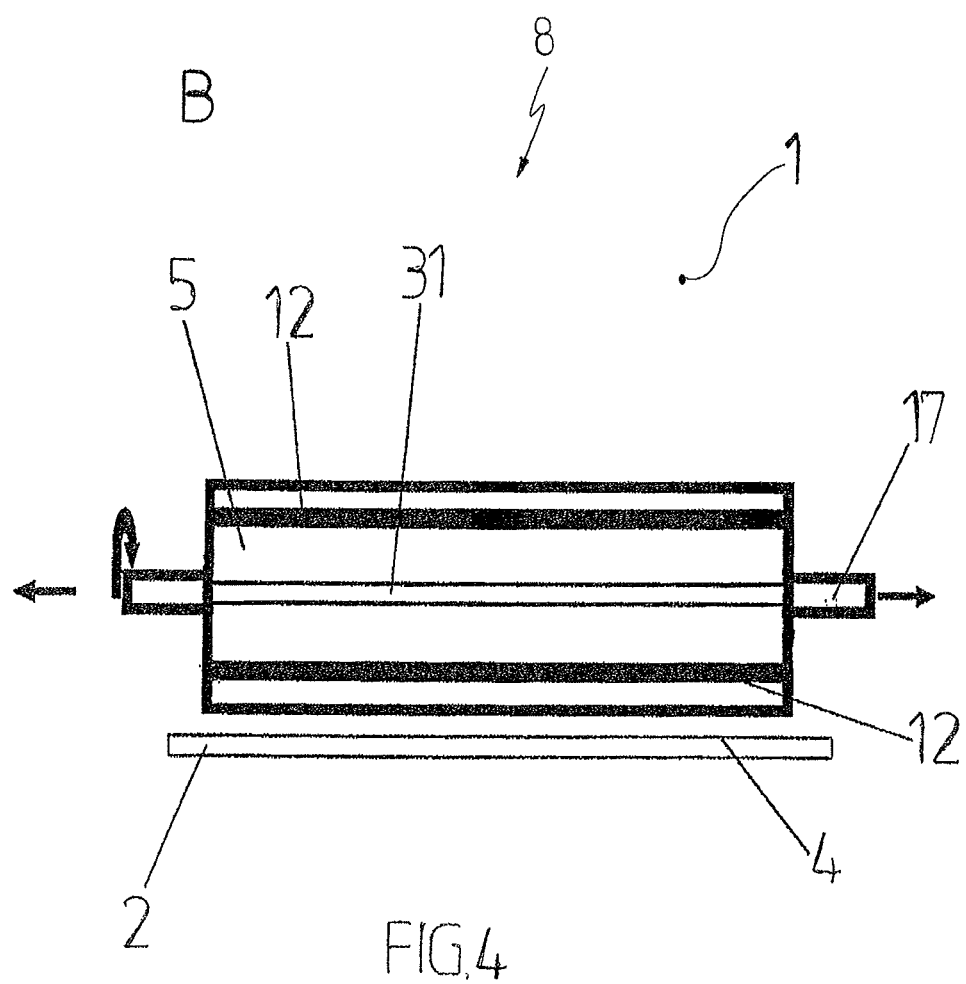
FIG. 4 shows schematically still another embodiment of the apparatus according to the present invention.

In FIG. 4 there is shown a schematical side view of the source 8 according to an embodiment of the present invention for feeding first starting material A on the surface 4 of the substrate 2. The source 8 is again positioned in the atmosphere 1, which comprises second starting material B. The source 8 comprises a gas feeding member 5 for feeding first starting material A on the surface 4 of the substrate 2 as well as a second rotation axis 17, about which the gas delivery means 5 is rotatable. Gas feeding member 5 is preferably a cylindrical part which has substantially circular cross section. Alternatively the gas feeding member 5 may also have a cross section of another shape, such as oval, triangle, square or some other polygonal shape. The length of the gas feeding member 5 in the direction of the second rotation axis 17 may vary according to each application and may be adapted to correspond substantially for example the width of the substrate, such as material web, being treated. It is essential, that the present invention is not limited to any single form of gas feeding member 5 but that the gas feeding member 5 may be realized in any shape. However the gas feeding member 5 is preferably rotationally symmetrical relative to the second rotation axis 17. In addition, the second rotation axis 17 is positioned to pass preferably along the centre axis of the gas feeding member 5.

The gas feeding member 5 is adapted to feed a first starting material A substantially in a transversal direction in relation to the second rotation axis 17. According to FIG. 4 the gas feeding member 5 is provided with one or more starting material zone(s) 12, adapted to feed first starting material A. The gas feeding member 5 may also comprise one or more flushing agent zone(s) (not shown) for feeding flushing agent. In addition, the gas feeding member 5 may be provided with one or more suction zone(s) 31 for drawing and discharging first starting material A or flushing agent. According to FIG. 4, the starting material zones 12 and the suction zones 31 are provided to extend substantially in the direction of the second rotation axis 17 of the gas feeding member 5. In other words the starting material zones 12 and the suction zones 31 are longitudinal channels, which extend along the length of the gas feeding member 5. Alternatively the starting material zones 12 and the suction zones 31 may also be shorter and may extend only a part of the length of the gas feeding member 5, whereupon two or more of these may be present also in the direction of the second rotation axis 17 successively in the same line.

As described previously, first starting material A may be fed from the gas feeding member 5 via the starting material zone 12 substantially transversally, perpendicularly or radially in relation to the second rotation axis 17. The gas feeding member 5 may also comprise one or more flushing agent zone(s) (not shown) for feeding flushing agent on the surface 4 of the substrate 2.

Suction zones 31 may be provided on the gas feeding member 5 in the same manner as with the aforementioned starting material zones 12. By means of suction zones 31 first starting materials A or flushing agents or both may be removed from the surface 4 of the substrate 2 or proximity thereof. Suction zones 31 are preferably provided to remove starting materials or flushing agents from the surface 4 of the substrate or proximity thereof substantially in transversal direction, perpendicular direction or radially in relation to the second rotational axis 17 of the gas feeding member 5. By this source 8 according to FIG. 4 the surface 4 of the substrate 2 may be exposed to a first starting material A and at the same time by means of the suction zones an excess first starting material A may be drawn from the surface 4 of the substrate 2. This source 8 or the gas feeding member 5 thereof may be moved also in horizontal direction, for example with a reciprocating movement over the surface 4 of the substrate 2. The rotational movement of the gas feeding member 5 about the second rotational axis 17 permits to feed quickly the first starting material A and thus combined to the horizontal movement to deposit quickly the substrate 2, when the second starting material B is in atmosphere 1. When the gas feeding member 5 is positioned at a distance from the surface of the substrate 2, the second starting material B is able to flow below the gas feeding member 5 when the starting material zone 12 is not exactly towards the surface of the substrate 2. By means of the suction zones 31 absorption of the second starting material B under the gas feeding member 5 may be enhanced. Then the surface 4 of the substrate 2 may be exposed both to the first and the second starting material A, B even though the gas feeding member 5 is not moved in a horizontal direction relative to the substrate 2.

Figure 5:
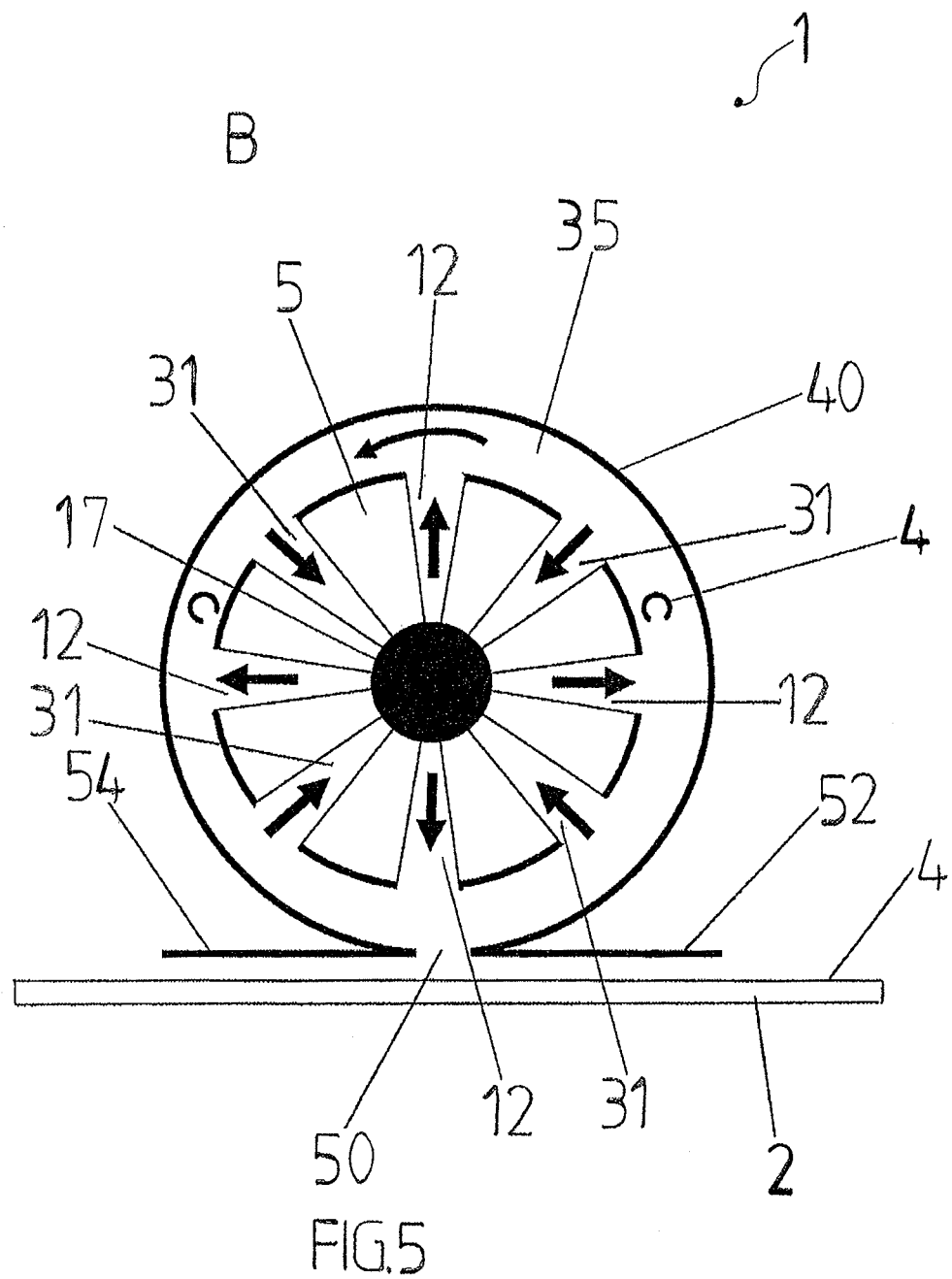
FIG. 5 shows schematically a side view of the apparatus according to FIG. 4.

In FIG. 5 there is shown a schematic cross section of the source 8 of FIG. 4, which comprises a gas feeding member 5, which is rotatable about a second rotation axis 17. The gas feeding member 5 comprises several starting material zones 12 for feeding first starting material A. The starting material zones 12 and the suction zones 31 are preferably positioned alternately in the direction of the circumference of the gas feeding member 5, as shown in the cross sectional view 5. There may be one or more gas feeding zones 12, and one or more, or none, suction zones 31. The first starting material A may be fed in all cases alone or it may be fed by means of a carrier gas. Carrier gas may be fed together with the first starting material A so that the carrier gas carries the first starting material A on the surface 4 of the substrate 2 however without participating in the surface reaction itself. The carrier gas is preferably an inert gas, like nitrogen, which does not react with the first starting material A.

According to FIG. 5, the gas feeding member 5 is adapted, according to arrows shown therein, to feed first starting material A substantially transversally or radially in relation to the second rotation axis 17. Preferably the gas feeding member 5 is adapted to feed first starting material A substantially in a perpendicular direction in relation to the second rotation axis 17. In the simplest form of the present invention the gas feeding member 5 comprises only one starting material zone 12, through which first starting material A may be fed. The source 8 or the gas feeding member 5 is preferably arranged so that the second rotation axis 17 extends substantially in the direction of the surface 4 of the substrate 2.

In the embodiment of FIG. 5 the source 8 comprises a suction enclosure 30, which provides a suction chamber 35, which has suction apertures 42. The suction enclosure 30 further comprises a flow aperture 50, which extends substantially in the direction of the second rotation axis 17 of the gas feeding member and through which the first starting material A and any flushing agents are fed on the surface 4 of the substrate 2 and respectively removed from the surface 4 of the substrate 2. The flow aperture 50 is made narrow in the direction perpendicular to the second rotation axis 17 relative to the diameter of the gas feeding member 5 so that the fed first starting material A or flushing agent does not spread over a large area. In addition, the suction enclosure 30 is provided with a first and a second flange 52, 54, which extend from the edge of the flow aperture 50 in the direction of the surface 4 of the substrate 2 away from the flow aperture 5 according to FIG. 5 and along the length of the second rotation axis 17 of the gas feeding member 5. Flanges 52, 54 provide a diffusion barrier preventing the flow of gases from the feed aperture 50 to the environment and from the environment to the flow aperture 50 however allowing thus the surface 4 of the substrate 2 to be exposed efficiently to the first starting material A at the location of the flow aperture 50. It is to be noted, that in certain embodiments the flange may also be provided to only one side of the flow aperture 50. Flanges 52, 54 or one of them may be replaced by other type of diffusion barriers. Such a source comprising a suction enclosure does not allow the first starting material A to pass into the atmosphere 1, which has a second starting material B, whereupon unwanted reactions of starting materials may be avoided. Such an enclosed source 8 is preferably movable over the surface 4 of the substrate 2 relative to the substrate so that the surface 4 of the substrate 2 is exposed upon sweeping of source 8 to the first starting material A and after the sweeping to the second starting material B present in the atmosphere.

Above, with reference to FIGS. 1 to 5 different sources 6, 7, 8 are described, which are all adapted to expose locally the surface 4 of the substrate 2 to a first starting material A. The facts described in connection with each source 6, 7, 8 concerning the movement of the source or the gas feeding member 3, 5 thereof relative to the substrate and placing above the substrate are valid for all sources 6, 7, 8. In addition, the apparatus according to the invention may comprise one or more sources 6, 7, 8 and they may be positioned in such a manner that the substrate 2 is exposed to the second starting material present in the atmosphere 1 between the sources 6, 7, 8. The source 6, 7, 8 may be positioned inside into a separate deposition chamber (not shown), which has an atmosphere 1, which comprises the second starting material B. The deposition chamber may be provided so that the substrate or the substrates are brought through the deposition chamber or alternatively the substrate is placed inside the deposition chamber and the deposition chamber is closed for the processing time according to the batch process. Vacuum or overpressure may be inside the deposition chamber, or it may be at normal atmospheric pressure (NTP; 1 bar, 0° C.). Alternatively the source 6, 7, 8 is not positioned inside a separate deposition chamber but the source 6, 7, 8 is positioned directly in the room space, process space or in connection with another apparatus or chamber in which the atmosphere 1 comprises a second starting material B. In a preferred embodiment, the apparatus comprises feeding means (not shown) for feeding second starting material B into the atmosphere 1 surrounding the source 6, 7, 8, such as a deposition chamber, process space or other corresponding space. The feeding means may comprise a starting material container, a possible pump, a tubing for conducting the second starting material B into the atmosphere 1 surrounding the source 6, 7, 8 or the deposition chamber as well as a feeding member, like a nozzle or other corresponding terminal device for feeding the second starting material B into the atmosphere 1 or the deposition chamber. In a preferred embodiment the feeding means for feeding second starting material B are stationary and provided for example in the deposition chamber so that the second starting material may be fed in the deposition chamber through the wall thereof. In other words, the feeding means for feeding the second starting material B and the source 6, 7, 8 are separated in relation to each other and thus the feeding of the second starting material B is independent of the movement of the source 6, 7, 8 and the feedings of the first and the second starting material A, B are independent of each other. Thus the first starting material A is adapted to be fed via the source 6, 7, 8 locally on the surface of the substrate and the second starting material B is fed separately into the atmosphere 1 surrounding the source 6, 7, 8 independently of the source 6, 7, 8 and separately thereof. This means that the second starting material 1 is not fed according to the invention from the source 6, 7, 8. The second starting material B is thus not fed actively on the surface of the substrate and it, but the second starting material B is located, or is brought, only passively in the atmosphere surrounding the source 6, 7, 8, whereupon the surface of the substrate is exposed to the second starting material B continuously when it is not exposed to the first starting material A under the influence of the source 6, 7, 8.

The apparatus according to the present invention for processing a surface 4 of a substrate 2 by exposing the surface 4 of the substrate 2 to alternating surface reactions of at least a first starting material A and a second starting material B according to the principles of atomic layer deposition method may comprise one or more of the aforementioned sources 6, 7, 8. The source 6, 7, 8 is adapted to feed a first starting material A locally on the surface 4 of the substrate 2. The source is further positioned in the atmosphere 1, which comprises second starting material B. The source 6, 7, 8 is further adapted to be movable in relation to the substrate 2 on the surface 4 thereof or in the proximity of the source 4 so that with the source 6, 7, 8 it is possible to sweep over the surface 4 by exposing locally the surface 4 at the same time to a first starting material. After the sweeping the source 6, 7, 8 moves away from the part of the surface 4 swept, whereupon the part of the surface 4 swept is exposed to the second starting material present in the atmosphere 1. Exposure to starting materials A and B produces always a surface reaction on the surface 4 of the substrate 2 according to the principles of the ALD method. In all of the embodiments of the sources 6, 7, 8 described above the source 6, 7, 8 is adapted to be movable on the surface 4 of the substrate 2 or in the proximity thereof in relation to the substrate (2) for performing the sweeping. This means that the source 6, 7, 8 may be moved on the surface of the substrate, the substrate 2 may be moved in relation to a stationary source 6, 7, 8 or both the source 6, 7, 8 and the substrate 2 may be moved. The movement of the source 6, 7, 8 may be a transferring movement occurring on a plane, a reciprocating movement or a rotating movement or a combination thereof. The apparatus according to the invention may comprise two or more sources 6, 7, 8, which are separated from each other by a slit or a space in flow connection with the surrounding atmosphere 1 in order to expose the surface 4 of the substrate 2 to a second starting material B in between the sources. Alternatively each source 6, 7, 8 may comprise or more starting material zones 10, which are separated from each other with a slit or a space in flow connection with the surrounding atmosphere 1 in order to expose the surface 4 of the substrate 2 to a second starting material B in between the starting material zones 10. It is also possible to provide a source 6, 7, 8, which comprises two or more starting material members 3, 5, which are separated from each other by a slit or a space opening to the surrounding atmosphere 1 in order to expose the surface 4 of the substrate 2 to a second starting material B in between the starting material feeding members 3, 5.

As starting materials A and B any starting materials typically used in the ALD method may be used. As a first starting material A for example TMA (trimethyl aluminium) may be used, and as the second starting material B water steam. In certain applications the second starting material B may be reactive or non reactive, air or oxygen. Alternatively the first and the second starting material A, B may also be plasma or radical or may be arranged to provide a sparkle.

The present invention further relates to a method for processing the surface 4 of the substrate 2 by exposing the surface 4 of the substrate 2 to alternating surface reactions of at least a first starting material A and a second starting material B according to the principles of atomic layer deposition method. The method includes feeding on the surface 4 of the substrate 2 locally a first starting material A by using the source 6, 7, 8 by moving the source 6, 7, 8 in relation to the substrate 2, and exposing the surface 4 of the substrate 2 processed with the first starting material A to a second starting material B present in an atmosphere 1 surrounding the source 6, 7, 8. In other words, according to the present invention the second starting material B may be fed into the atmosphere 1 surrounding the source 6, 7, 8, such as a deposition chamber, and thus to expose the surface of the substrate to the second starting material B. The second surface material B is fed into the atmosphere 1 preferably independently of the source 6, 7, 8. In other words, the second starting material is fed preferably from one or more stationary feeding point(s) into the atmosphere 1. Then the concentration of the second starting material B may be obtained stable in the atmosphere 1 surrounding the source 6, 7, 8 independently of the movement of the source 6, 7, 8. This further ensures a stable deposition result. As described before, the feeding of the first feeding material A and the second feeding material B are independent of each other and the movement of the source 6, 7, 8. Further, it is to be noted that in every case the feeding of the second material B is not necessary, if for example humidity present in the air is sufficient as a second starting material B. The surface of the substrate is thus exposed actively by means of the source 6, 7, 8 to the first starting material A and passively to the second starting material B present in the atmosphere. The moving of the source 6, 7, 8 is performed in the method as described hereinbefore. Thus the surface 4 of the substrate 2 is exposed alternately to the first starting material A fed by the source 6, 7, 8 and to the second starting material B present in the atmosphere 1.

Although several embodiments and features according to the present invention are described hereinbefore, all of which are not shown in the accompanied embodiment, it is clear that all of the features shown may be combined in order to provide in each case the preferred embodiment.

It is clear to a person in the art that with technical developments the basic idea may be realized in many different ways. Thus the invention and the embodiments thereof are not limited to the examples shown hereinbefore but may instead vary within the frames of the claims.

The invention claimed is:

1. A method for processing a surface of a substrate by exposing the surface of the substrate to alternating surface reactions of at least a first starting material and a second starting material according to principles of atomic layer deposition method, wherein the method includes:
    arranging a deposition chamber having a space and positioning a source inside the space of the deposition chamber,
    feeding on the surface of the substrate locally inside the deposition chamber a first starting material by means of a source by moving the source inside the deposition chamber on the surface of the substrate, and
    exposing the surface of the substrate processed with the first starting material to a second starting material by feeding the second starting material independently of the movement of the source to be introduced to the space of the deposition chamber such that the second starting material surrounds the source inside the deposition chamber.

2. The method according to claim 1, wherein the source is moved substantially in a direction of the surface of the substrate or in a proximity of the surface of the substrate.

3. The method according to claim 1, wherein the source is moved substantially in the direction of the surface of the substrate with a reciprocating movement on the surface of the substrate or in the proximity thereof in relation to the substrate.

4. The method according to claim 1, wherein the substrate is moved in relation to the source.

5. The method according to claim 1, wherein the source is rotated in relation to the surface of the substrate.

6. The method according to claim 5, wherein the source comprises a rotatable starting material feeding member, which is rotated about a first rotation axis, and from which source the first starting material is fed substantially in the direction of the first rotation axis.

7. The method according to claim 5, wherein the source comprises a rotatable starting material feeding member, which is rotated about a second rotation axis, and from which source the first starting material is fed substantially transversally, radially or perpendicularly in relation to the second rotation axis.

8. The method according to claim 1, wherein flushing agent is fed on the surface of the substrate by means of the source in order to flush the surface of the substrate.

9. The method according to claim 1, wherein first starting material or flushing agent is removed from the surface of the substrate by means of suction provided by the source, or vacuum is provided between the source and the surface of the substrate by means of the suction of the source.

10. The method according to claim 1, wherein the surface of the substrate is exposed alternately to the first starting material fed by the source and to the second starting material present in the atmosphere.

11. The method according to claim 1, wherein a first starting material is fed on the surface of the substrate successively with two or more sources by exposing the surface of the substrate between the sources to a second starting material present in the atmosphere.

12. The method according to claim 1, wherein the first or the second starting material is one of plasma, radical, or a material that is configured to provide a sparkle.

13. The method according to claim 1, wherein the second starting material is reactive or non reactive.

14. The method according to claim 1, wherein the second starting material is air, water vapor or oxygen.

* * * * *